US012813238B2

(12) United States Patent
Scherer

(10) Patent No.: US 12,813,238 B2
(45) Date of Patent: Nov. 24, 2026

(54) INSULATING SELF-DEVELOPING RESIST FOR ELECTRONIC DEVICES AND QUANTUM POINT CONTACTS

(71) Applicant: CALIFORNIA INSTITUTE OF TECHNOLOGY, Pasadena, CA (US)

(72) Inventor: Axel Scherer, Barnard, VT (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 638 days.

(21) Appl. No.: 18/451,808

(22) Filed: Aug. 17, 2023

(65) Prior Publication Data

US 2024/0234206 A1 Jul. 11, 2024

Related U.S. Application Data

(60) Provisional application No. 63/399,510, filed on Aug. 19, 2022.

(51) Int. Cl.

| | |
|---|---|
| ***H10W 20/00*** | (2026.01) |
| ***B82Y 10/00*** | (2011.01) |
| ***B82Y 40/00*** | (2011.01) |
| ***G03F 7/20*** | (2006.01) |
| ***H10P 50/00*** | (2026.01) |
| ***H10W 20/48*** | (2026.01) |

(52) U.S. Cl.

CPC ........... *H10W 20/057* (2026.01); *B82Y 10/00* (2013.01); *B82Y 40/00* (2013.01); *G03F 7/2059* (2013.01); *H10P 50/73* (2026.01); *H10W 20/48* (2026.01)

(58) Field of Classification Search

CPC . H10W 20/057; H10W 20/48; H10W 20/089; B82Y 10/00; B82Y 40/00; G03F 7/2059; H10P 50/73; H10D 48/383; H10N 99/05

USPC ..................................................... 430/5, 311

See application file for complete search history.

(56) References Cited

U.S. PATENT DOCUMENTS

| | | | |
|---|---|---|---|
| 2014/0356791 | A1 | 12/2014 | Liu et al. |
| 2015/0348969 | A1 | 12/2015 | Edwards et al. |
| 2018/0291498 | A1 | 10/2018 | Chan et al. |
| 2020/0006037 | A1 | 1/2020 | Maitre et al. |

OTHER PUBLICATIONS

International Search Report and Written Opinion issued for International PCT Application No. PCT/US2023/030515 filed on Aug. 17, 2023 on behalf of California Institute of Technology. Mail Date: Dec. 12, 2023. 12 pages.

Saifullah, Mohammad S. M. et al., "Review of metal-containing resists in electron beam lithography: perspectives for extreme ultraviolet patterning" Journal of Micro/Nanopatterning, Materials, and Metrology, vol. 21, Issue 4, 041402, Jun. 2, 2022 https://doi.org/10.1117/1.JMM.21.4.041402. 35 pages.

(Continued)

*Primary Examiner* — Caleen O Sullivan

(74) *Attorney, Agent, or Firm* — Steinfl + Bruno LLP

(57) ABSTRACT

Methods for utilizing irradiation to selectively transform insulating self-developing resists, such as metal fluorides, into electrically conductive metals are described. The disclosed methods enable the fabrication of electrical components and structures with critical dimensions below 5 nanometers. Selective irradiation induces the conversion of insulating metal fluoride compounds into metals in predefined regions. Examples of applications include miniature wiring, quantum point contacts, miniature electroplating and via-holes fabrication by using fluoride as etching mask.

18 Claims, 11 Drawing Sheets

(56) References Cited

OTHER PUBLICATIONS

Elzerman, J.M. et al. "Single-shot read-out of an individual electron spin in a quantum dot". Nature 430, pp. 431-435. Jul. 22, 2004. https://doi.org/10.1038/nature02693. 13 pages.
Smith, D. P. E. "Quantum point contact switches". Science Jul. 21, 1995. vol. 269, Issue 5222, pp. 371-373. 4 pages.
Van Wees, B.J. et al. "Quantized conductance of point contacts in a two-dimensional electron gas". Physical Review Letters. vol. 60, Issue 9. Feb. 29, 1988. pp. 848-850. 3 pages.
Wharam, D. A. et al. "One-dimensional transport and the quantisation of the ballistic resistance." Journal of Physics C: Solid State Physics. vol. 21, No. 8. Jan. 28, 1988. pp. L209-L214. 6 pages.

INSULATING SELF-DEVELOPING RESIST FOR ELECTRONIC DEVICES AND QUANTUM POINT CONTACTS

CROSS REFERENCE TO RELATED APPLICATIONS

The present application claims priority to U.S. Provisional Patent Application No. 63/399,510 filed on Aug. 19, 2022, which is incorporated herein by reference in its entirety.

FIELD

The presented disclosure is related to nanofabrication techniques for nanoelectronic devices and structures. More in particular, the disclosed teachings include methods of using irradiation to selectively convert insulating self-developing resists such as metal fluorides into conducting metals as a way to enable electrical elements and structures with dimensions below 5 nm.

BACKGROUND

With the continual miniaturization of microelectronic devices into the nanometer scale, conventional microfabrication techniques are approaching fundamental limits. As an example, processes such as photolithography, which pattern device structures by depositing metals through lithographic masks, encounter significant challenges when critical dimensions reach the less than 7 nm, and more in particular, 1-2 nm. In what follows, the challenges to fabricate nanodevices at such tiny scales are further described using exemplary structures and devices.

A quantum point contact (QPC) is a narrow constriction between two electrically conducting regions, of a width comparable to the electronic wavelength. The importance of QPCs lies in the fact that they take advantage of quantization of ballistic conductance in mesoscopic systems. FIG. 1 shows a schematic plot of point-contact conductance as a function of gate voltage. As shown, the conductance of a QPC is quantized in units of the conductance quantum, a consequence of the equipartition of current among an integer number of propagating modes in the constriction. At low temperatures and voltages, unscattered and untrapped electrons contribute to the current at their Fermi wavelength. Much like in a waveguide, the transverse confinement in the QPC results in a "quantization" of the transverse motion, the transverse motion has to be one of a series of discrete modes. The waveguide analogy is applicable as long as coherence is not lost. The electron wave can only pass through the constriction if it interferes constructively, which for a given width of constriction, only happens for a certain number of modes N. The current carried by such a quantum state is the product of the velocity times the electron density. These two quantities by themselves differ from one mode to the other, but their product is mode independent. As a consequence, each state contributes the same amount of e2/h per spin direction to the total conductance G=2Ne2/h. Metal QPCs are structures in which a 'neck' of atoms just a few atomic diameters wide (that is, comparable to the conduction electrons' Fermi wavelength) bridges two electrical contacts and have been very difficult to fabricate.

Quantum point contacts were first reported in GaAs/AlGaAs two-dimensional electron gas (2 DEG) channels by taking advantage of the large electron Fermi wavelength in this system at low temperatures. Point contacts were formed by applying a voltage to suitably shaped gate electrodes on the 2 DEG, so that the electron gas could be locally depleted. Conducting regions were thereby created in the plane of the 2 DEG, forming quantum dots and QPCs. Over the past several years, other ways of fabricating QPCs in metals have emerged. For example, QPCs have been realized in break-junctions by pulling apart a piece of conductor until it breaks. The breaking point forms the point contact but is very difficult to keep stable. Another means of creating QPCs is by positioning the tip of a scanning tunneling microscope close to the surface of a conductor. So far, QPCs have remained laboratory curiosities, as they can only be formed at low temperatures in high-mobility heterostructures or in mechanically unstable systems. Stable QPCs for circuits have so far been elusive as the dimensions required have been beyond our reach.

As silicon semiconductor devices are scaled down to nanometer dimensions, the underlying physics governing their behavior undergoes fundamental changes. Phenomena that previously allowed precise control of conductivity through doping are rendered inapplicable. At tiny scales of less than 7 nm, atomic dopants act as mere scattering centers rather than enhancing conductivity. Therefore, alternative approaches must be considered at the nanoscale.

One option may be vacuum tube devices comprised of electrodes surrounded by air or vacuum rather than semiconductors. However, these devices are presently limited by the high voltages required to induce current flow due to the work function of the electron emitter material. For example, tungsten has a work function around 4 eV. Even with modifications, the voltage remains on the order of volts, leading to extremely high impedance. This restricts applications, especially at high frequencies.

This limitation can be overcome by reducing the electrode gap such that direct electron tunneling between electrodes can effectively take place. As an example, by shrinking the gap below approximately 2 nm, the required voltage can be dramatically reduced along with device impedance. This is analogous to scanning tunneling microscopy, where atomic resolution imaging relies on maintaining sub-nanometer gaps during scanning. The challenge lies in fabricating such tiny gaps to create functional in-plane vacuum devices serving as transistor replacements in integrated circuits. Realizing this goal would allow improved scaling of electronic systems.

In view of the above, new nanofabrication methods capable of producing functional structures and devices at tiny length scales of less than 7 nm range are needed.

SUMMARY

The disclosed methods and devices address the problems and technical issues as described in the previous section.

According to a first aspect of the present disclosure, a method of fabricating a miniature quantum point contact is disclosed, the method comprising: providing a first layer, the first layer including metal; depositing a second layer on top of the first layer, the second layer comprising an insulating electron beam resist, and exposing the second layer to an electron beam to generate a miniature quantum point contact, the miniature quantum point contact having a constriction width of less than 7 nm.

According to a second aspect of the present disclosure, a method of fabricating a miniature wire is disclosed, the method comprising: providing a first layer comprising an insulated layer with two metal contacts on top; depositing a second layer on top of the first layer, the second layer comprising an insulating electron beam resist; exposing the second layer to an electron beam going from one metal contact to another metal contact of the two metal contacts, across an exposure line, thereby forming the miniature wire that connects the two metal contacts, the miniature wire having a width of less than 7 nm.

According to a third aspect of the present disclosure, a method of via-hole fabrication is disclosed, the method comprising: providing a first layer serving as a substrate; depositing a second layer on top of the first layer, the second layer comprising an electron beam resist; exposing the second resist layer with an electron beam to generate a miniature hole inside the second layer; the miniature hole having a constriction width of less than 7 nm; and by using the second layer as an etch mask, etching through the first layer, to generate a via through the miniature hole and inside the first layer, the via having with a width of less than 7 nm.

According to a fourth aspect of the present disclosure, a method of generating interconnects is disclosed, the method comprising: providing a first layer serving as a substrate; depositing a second layer on top of the first layer, the second layer comprising an electron beam resist; exposing the second layer with an electron beam to generate miniature trenches inside the second layer, based on an interconnection scheme, the miniature trenches having widths of less than 7 nm, and electroplating metal into the second layer along the miniature trenches.

According to a fifth aspect of the present disclosure, a method of fabricating an array of miniature quantum points contacts is disclosed, the method comprising: providing a first layer, the first layer including metal; depositing a second layer on top of the first layer, the second layer comprising an electron beam resist, and exposing the second layer to an array of electron beams to generate the array of miniature quantum point contacts, the miniature quantum point contacts having each a constriction width of less than 7 nm.

According to a sixth aspect of the present disclosure, A method of fabricating a miniature conducting point contact comprising: providing a first layer, the first layer including metal; depositing a second layer on top of the first layer, the second layer comprising an insulating electron beam resist, and exposing the second layer to an electron beam to generate a miniature conducting point contact, the miniature conducting point contact having a constriction width of less than 7 nm.

Further aspects of the disclosure are provided in the description, drawings and claims of the present application.

DETAILED DESCRIPTION

Throughout this document, the term "miniature", when used to describe a device or structure, is defined as having a width less than 7 nanometers (nm). As an example, a "miniature (QPC)" would indicate a QPC with a constriction width on the order of less than 7 nm, e.g., 2 nm. Other examples include a "miniature wire", referring to a conductive wire with a width below 7 nm, or a "miniature gap", signifying a separation between two surfaces, structures, or features that is less than 5 nm wide.

Throughout this document the term "electron beam resist" refers to materials, such as metal fluorides (e.g., $AlF_3$, LiF, $YbF_2$, or $CuF_2$, SrF2, BaF2, NaF, AgF, NbF5, CeF3, CaF2, MgF2, PbF2, or BiF3 etc.). Such materials can be changed by irradiation with an electron beam. Upon exposure, fluorine can evaporate from the exposed area, leaving the metal behind. According to the teachings of the present disclosure, this kind of process can occur at the nanoscale level and, as a result, features with dimensions of less than 7 nm, e.g. 1 nm, can be made when a well-focused electron beam is used to expose the electron beam resist, e.g., fluoride.

Figure 1:
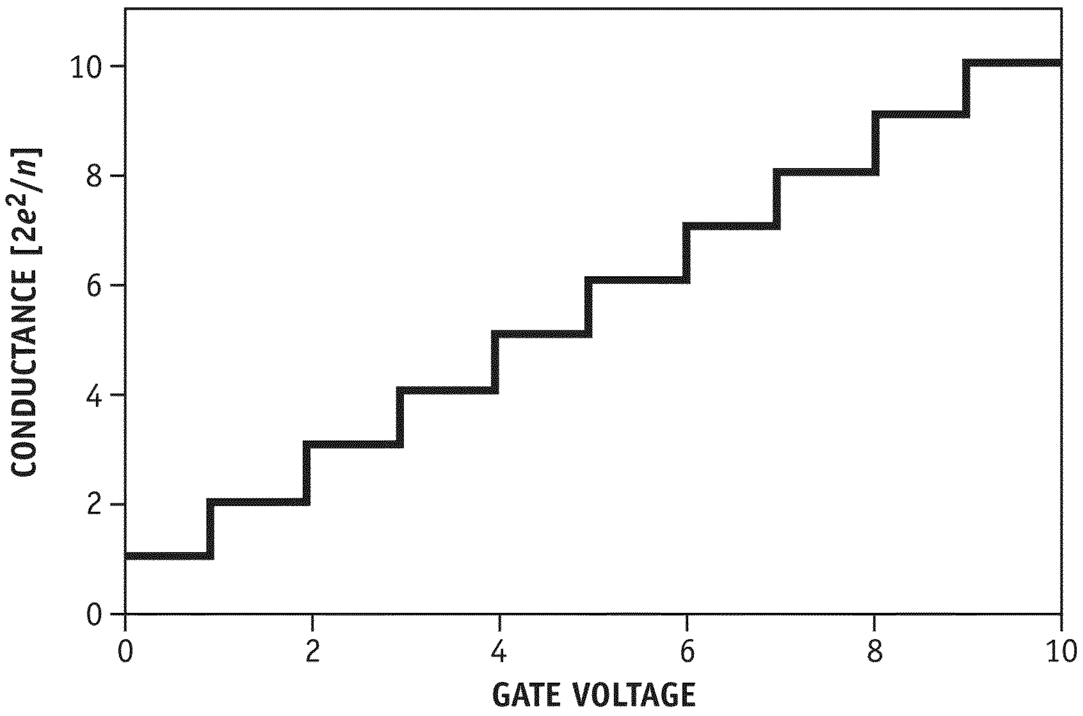
FIG. 1 shows a schematic plot of point-contact conductance as a function of gate voltage.
Figure 2A:
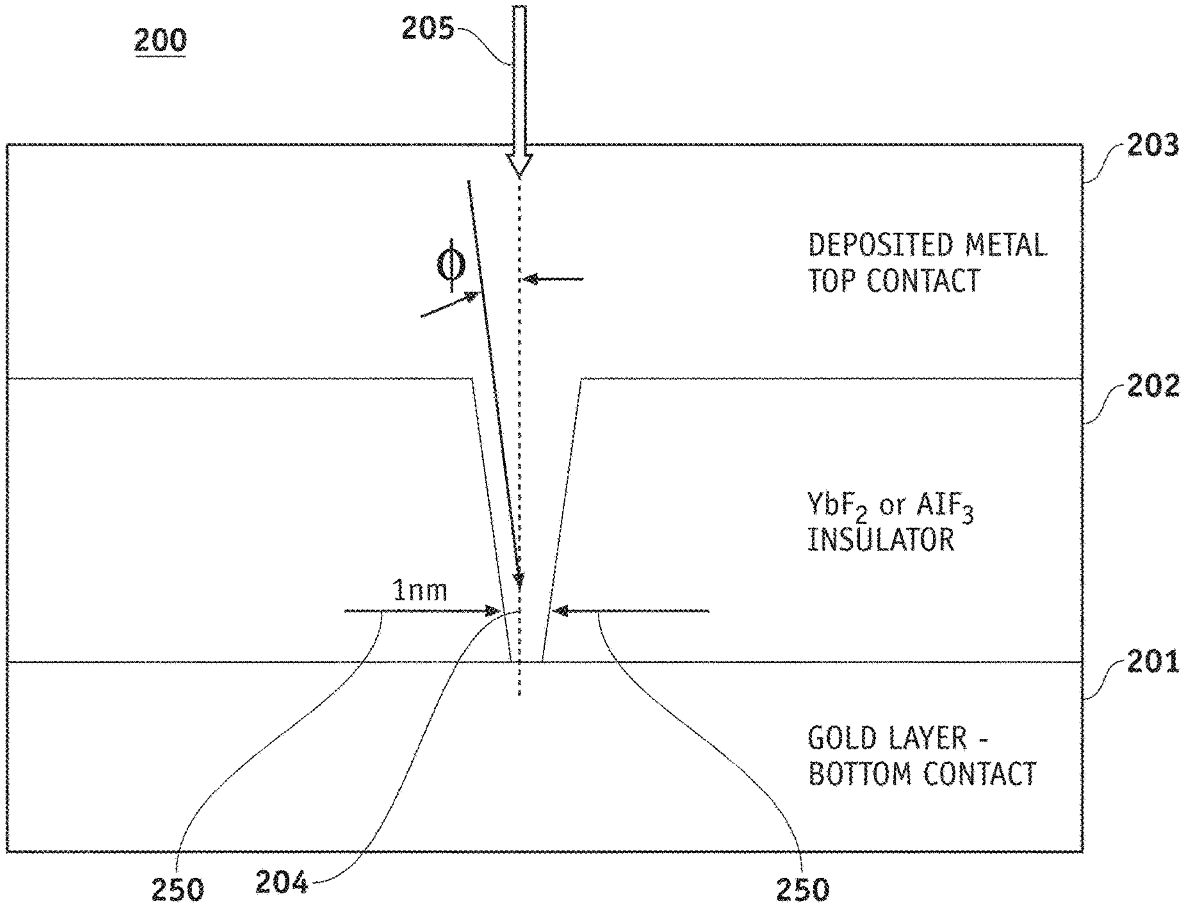
FIG. 2A shows an exemplary layered structure including miniature QPC according to an embodiment of the present disclosure.
Figure 2B:
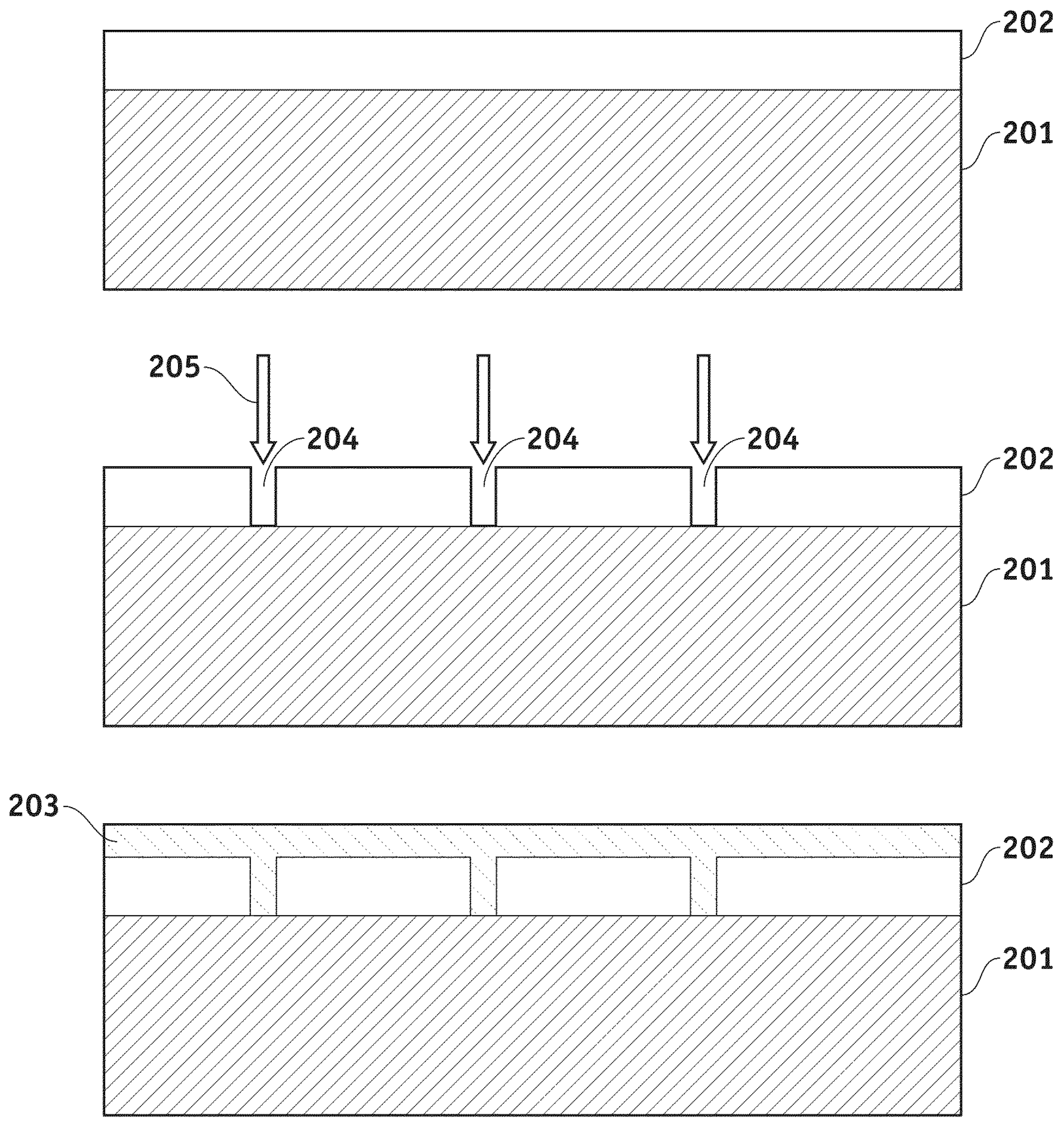
FIG. 2B shows an exemplary method and the fabrication steps to generate an array of miniature QPCs according to an embodiment of the present disclosure.

FIG. 2A shows a layered structure (200) including a miniature QPC (204), the figure illustrating an exemplary method to fabricate a miniature QPC (204) according to an embodiment of the present disclosure. FIG. 2B shows an exemplary method and the fabrication steps to generate an array of miniature QPCs (204) in accordance with the teachings of the present disclosure. The method comprises providing a first layer (201), depositing a second layer (202) on top of first layer (201), exposing layer (202) to an array of tightly focused electron beams (205) to produce point contacts (204) at the irradiated spot. This will be followed by depositing a third layer (203) on top of layer (202). The embodiment of FIG. 2B is an exemplary application of the teachings of the present disclosure. Such embodiment essentially demonstrates how to use, for example, fluoride as self-developing resist for point contact array fabrication. With reference to FIG. 2A, according to an embodiment of the present disclosure, the constriction width of QPC (204) as indicated by arrows (250), can be less than 7 nm, e.g. 1 nm, as indicated in the figure. With continued reference to FIGS. 2A-2B, the first layer (201) may be made of a metallic material, such as a pre-deposited metal or highly conducting semiconductor, such as gold, copper, aluminum, silicon, iron, nickel, chromium, platinum, or graphite.

On the other hand, the second layer (202) could be an electron beam resist, composed of various materials, such as fluoride-based materials including, for example, $AlF_3$, LiF, $YbF_2$, or $CuF_2$, SrF2, BaF2, NaF, AgF, NbF5, CeF3, CaF2, MgF2, PbF2, or BiF3. Serving as the top contact, the third layer (203), may also be a metal. In an exemplary embodiment where second layer (202) comprises metal fluoride, during electron irradiation, the fluoride loses its fluorine and converts into metal. The self-developing fluoride layer, with resistivities above $10^{15}$ ohm·cm, offers excellent electronic isolation. A point contact (204) is formed at the irradiated spot. In an exemplary fabrication process where the electron beam may be focused to, for example, 0.12 nm or less, the resulting point contacts can be between 0.5 and 2 nm in diameter. The embodiments of FIGS. 2A-2B are just examples demonstrating the disclosed teachings in the context of quantum point contacts. However, the disclosed teachings can be used to apply, generally, conducting contacts. Such conducting contacts may include metal point contacts and quantum point contacts.

Figure 3:
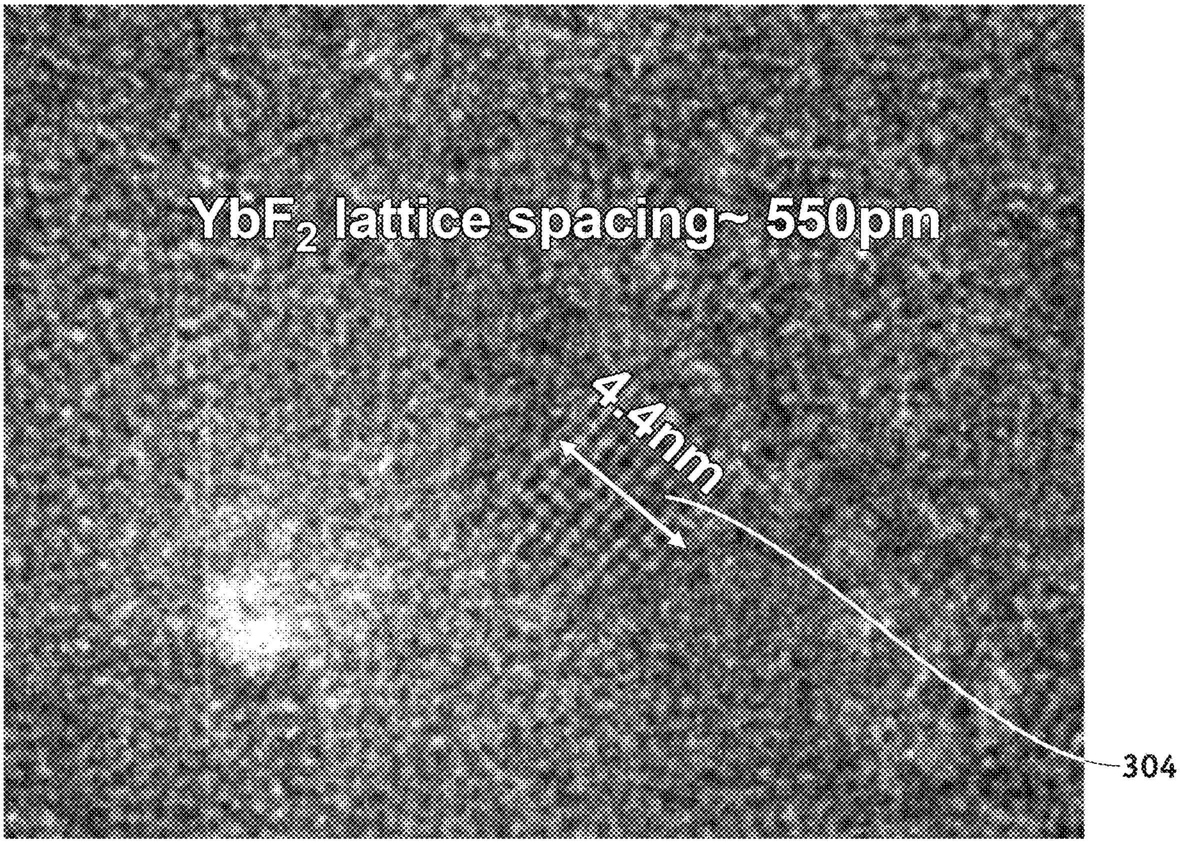
FIGS. 3-4 show exemplary arrays of QPCs fabricated according to the teachings of the present disclosure.
Figure 4:
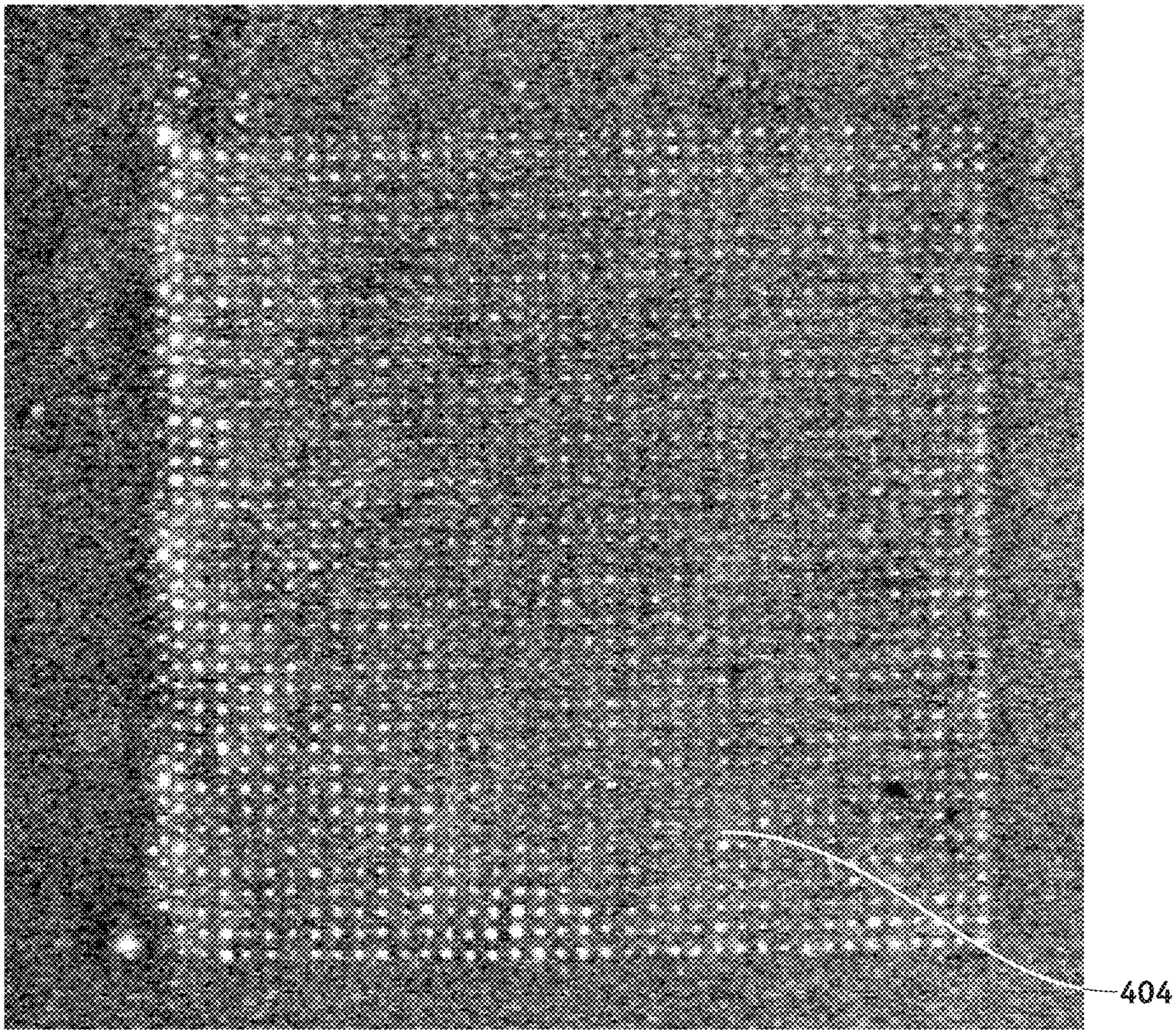
Figure 5A:
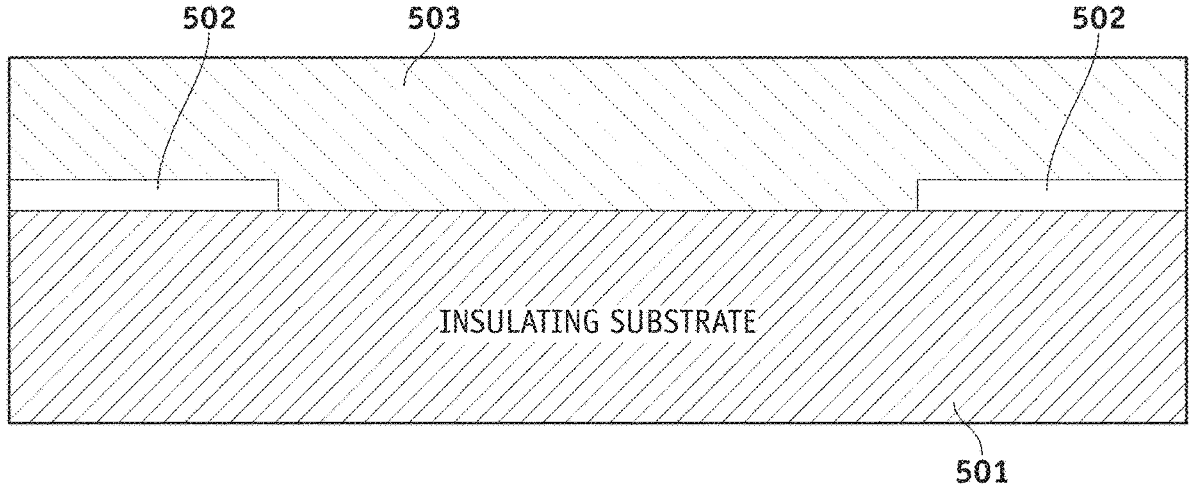
FIGS. 5A-5D show an exemplary method of fabricating a miniature wire according to an embodiment of the present disclosure.
Figure 5B:
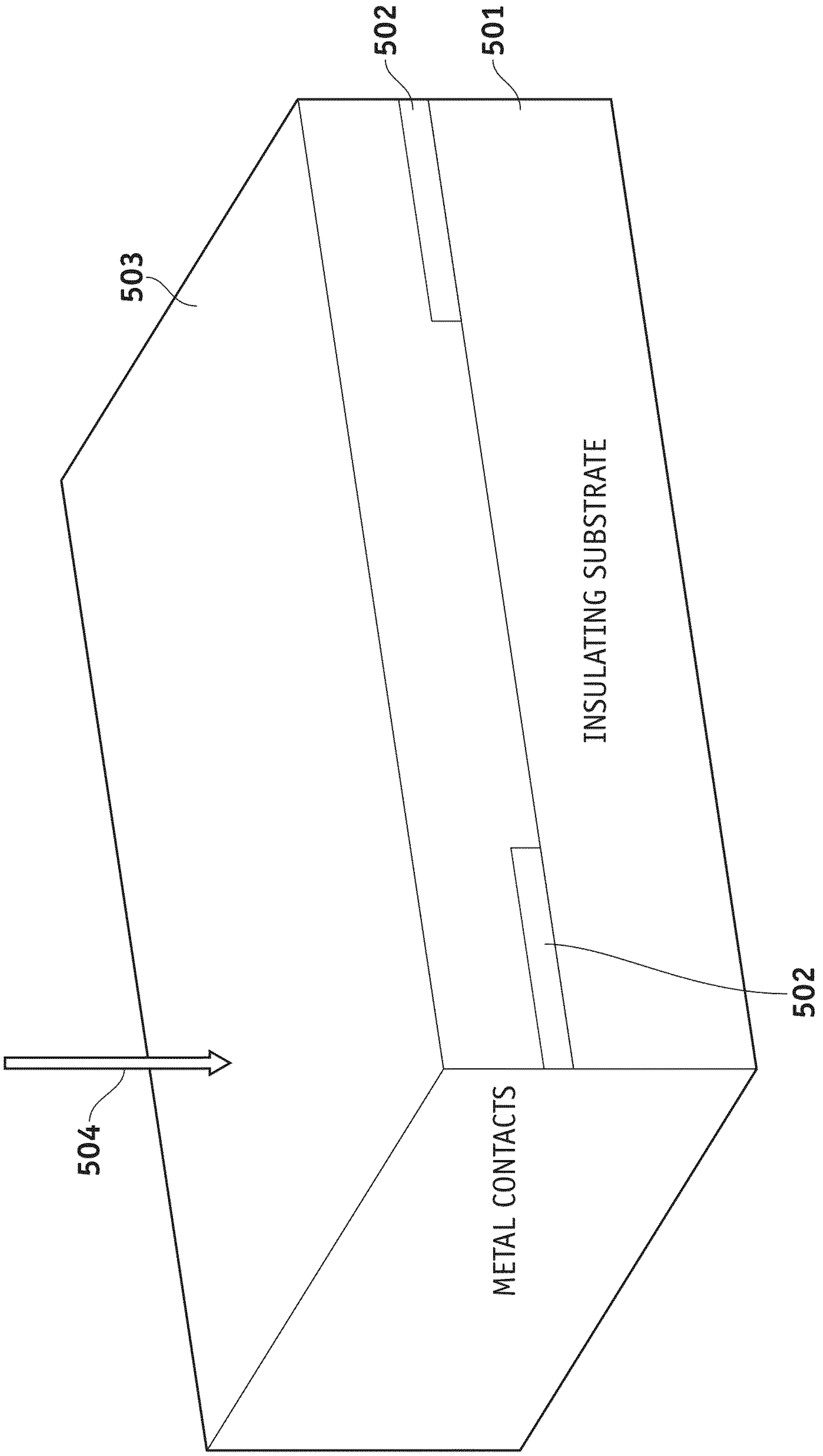
Figure 5C:
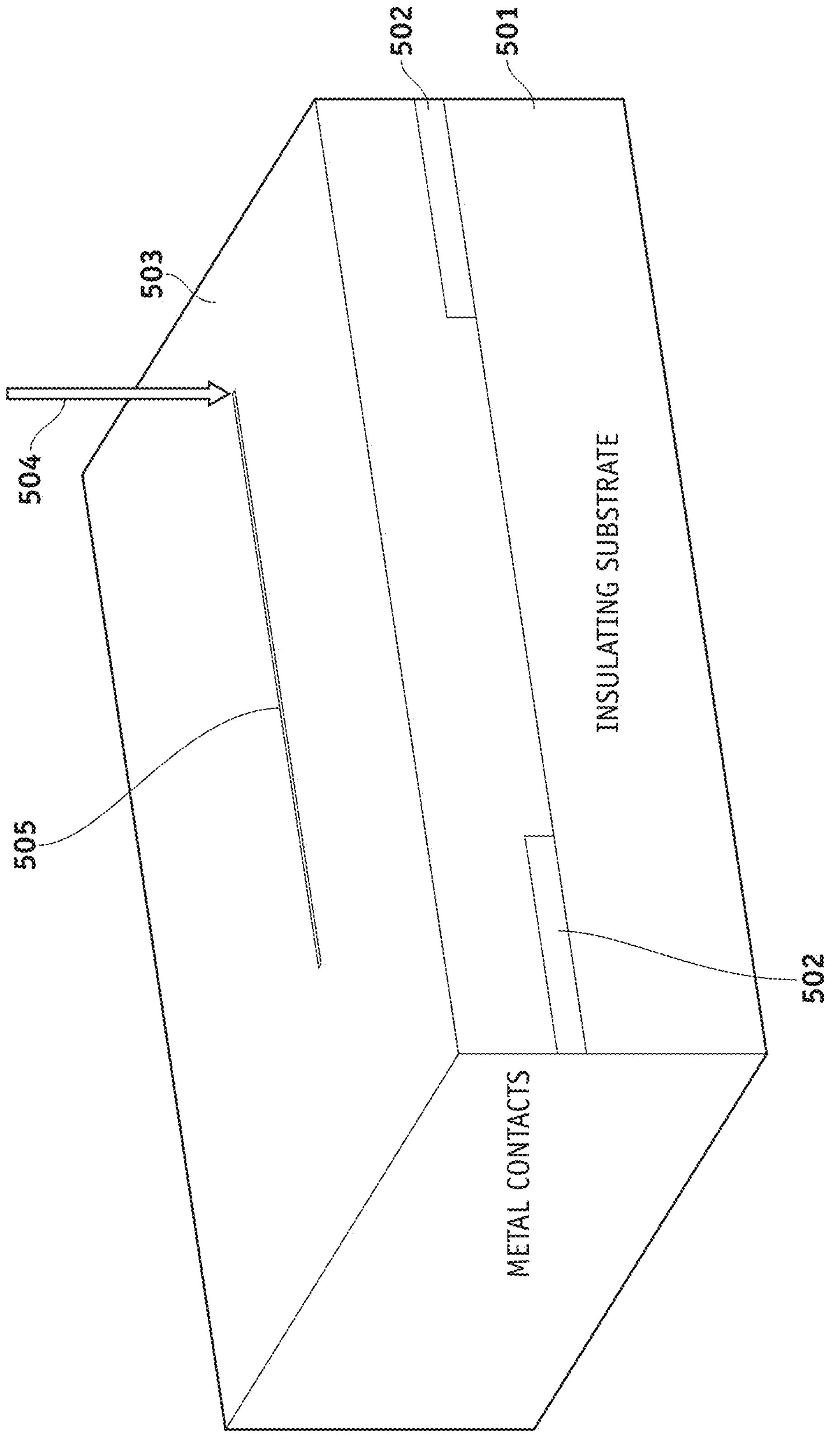
Figure 5D:
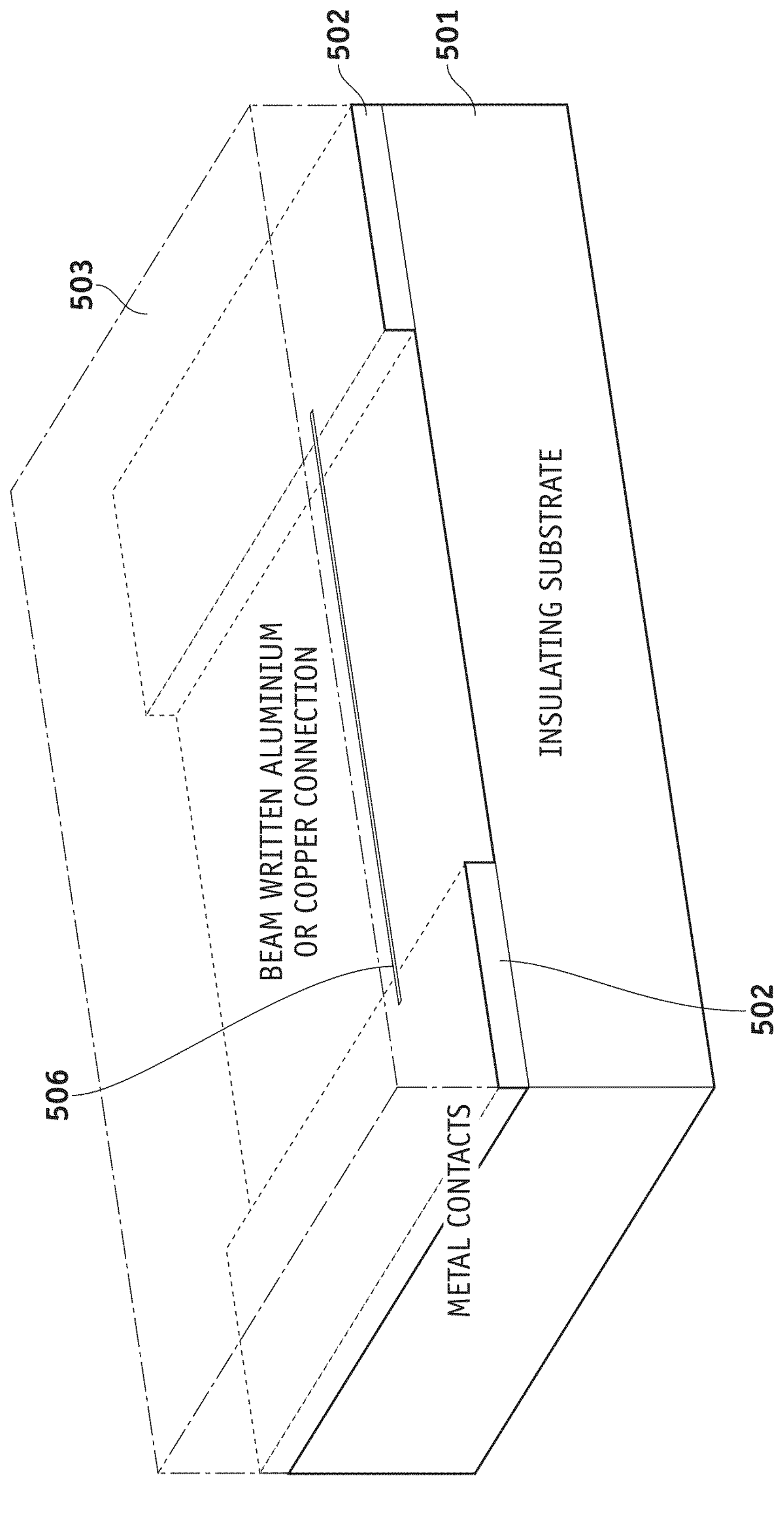

Various miniature features have been fabricated to show the feasibility of the disclosed teachings. As an example, FIG. 3 shows 1.5 nm QPCs (304) defined in 30 nm thick $YbF_2$ with a 160 kV electron beam. In this image, the lattice image of a crystal in the $YbF_2$ mask is used to characterize the diameter of an etched hole in Si3N4 to be 1.5 nm. One challenge is to deposit metal into the hole formed by the electron beam. In an embodiment, optimized methods for vacuum deposition or electroplating into fluoride layers without enlarging the QPC structure may be used. Methods of depositing noble metals such as Au, Cu or ferromagnets such as Ni, Co can enable the formation of dense arrays of optically or magnetically switchable point contacts. FIG. 4 shows an example of such array of QPCs (404) fabricated using the disclosed teachings.

QPCs can be used as extremely sensitive charge detectors. Since the conductance through the contact strongly depends on the size of the constriction, any potential fluctuation (for instance, created by light, magnetic fields, or other electrons) in the vicinity will influence the current through the QPC. It is possible to detect single electrons with such a scheme. In solid-state systems, QPCs can be used as readout devices for the state of quantum bits, as switches, or as transistors. Unlike previous QPC systems, the disclosed devices can be directly integrated into silicon CMOS electronic circuits. This will enable the harnessing of ballistic electron transport through essentially one-dimensional nanometer-scale channels and develop a compelling alternative to 2 DEG heterostructures, quantum wires or nanotubes made from materials systems that are difficult to integrate into silicon circuits.

Using the disclosed teachings, direct writing of miniature wire connecting to metal contacts is made possible. FIGS. 5A-5D illustrate an example of different steps to be taken to fabricate a miniature wire. A first layer comprising an insulated layer (501) with two metal contacts (502) on top is first provided. A second layer (503), comprising, for example, metal fluoride is then deposited on top of the first layer. The resulting structure is then exposed to electron beam going from one metal contact (502) to another, as indicated by the exposure line (505) of FIG. 5C, thereby writing a miniature wire (506) (FIG. 5D) that connects the metal contacts (502). In an embodiment, second layer (503) comprises metal fluoride. As a result of irradiation (504), the metal fluoride will lose fluorine and convert into metal along exposure line (505) which connects the two metal contacts (502). Examples of metals that can be used as part of the metal fluoride are aluminum and copper. In accordance with the teachings of the present disclosure, miniature wire (506) may be made with a width of less than 7 nm.

With continued reference to FIGS. 5A-5D, an optional step to the fabrication process may be added to protect the formed miniature wire (506) from oxidation. Such step includes the addition of an oxidation barrier layer (not shown) on top of second layer (503) to cover the miniature wire (506). In an embodiment, second layer (503) comprises $AlF_3$, while the optional oxidation barrier layer comprises $BaF_2$.

Figure 6:
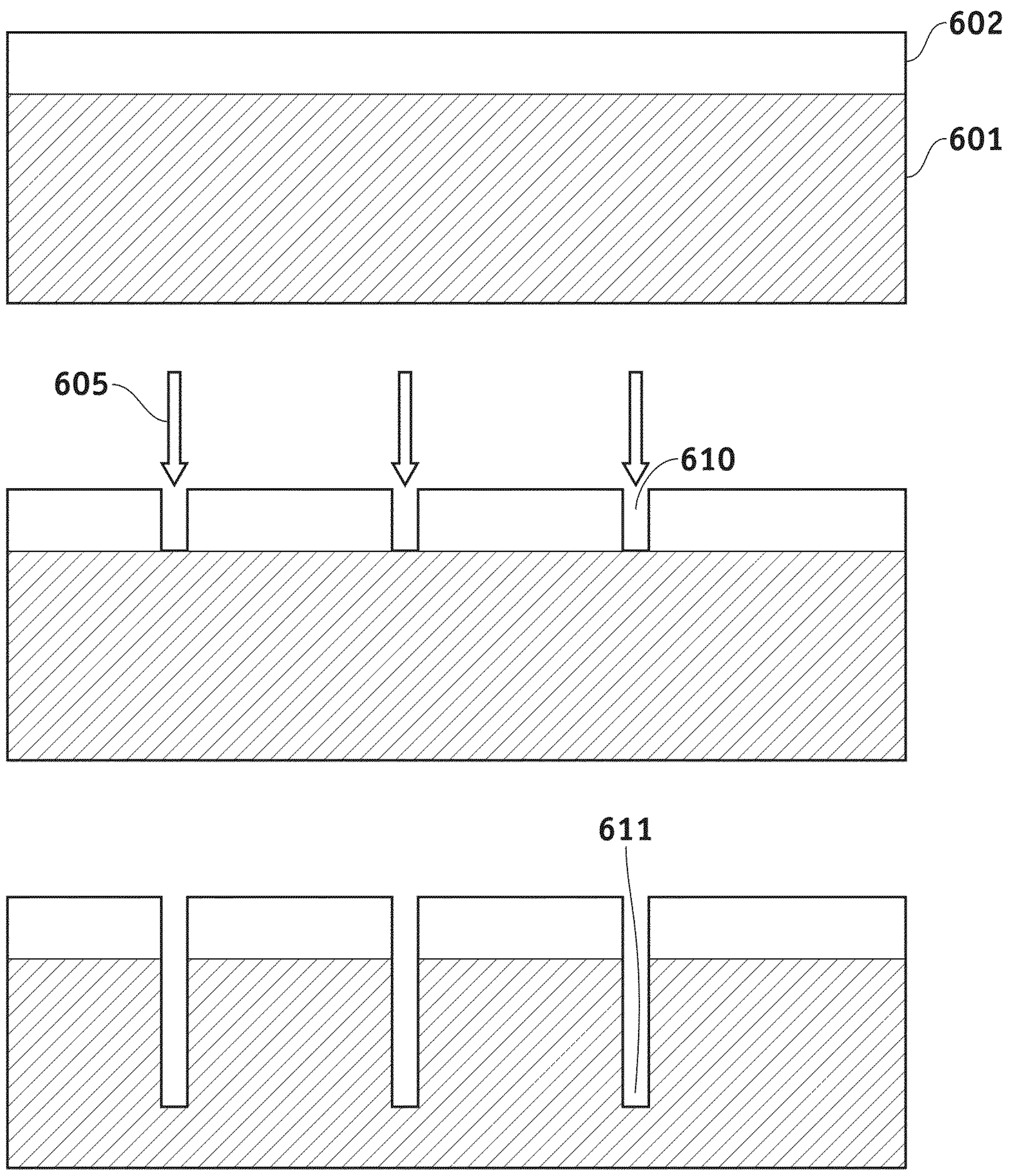
FIG. 6 shows an exemplary fabrication method according to the teachings of the present disclosure where fluoride is used as self-developing resist for etching mask.

FIG. 6 shows an exemplary via-hole fabrication method according to the teachings of the present disclosure. The method essentially demonstrates how to use, for example, fluoride as self-developing resist for etch masking. A first layer (601) is first provided, the layer serving as a substrate. A second layer (602) is then deposited on top of first layer (601). The second layer (602) can be composed of various materials, such as fluoride-based materials including, for example, $AlF_3$, LiF, $YbF_2$, or $CuF_2$, SrF2, BaF2, NaF, AgF, NbF5, CeF3, CaF2, MgF2, PbF2, or BiF3. The structure is then exposed with electron beams (605) to generate miniature holes (610). The second layer (602) is subsequently used as an etch mask to generate vias (611).

Figure 7:
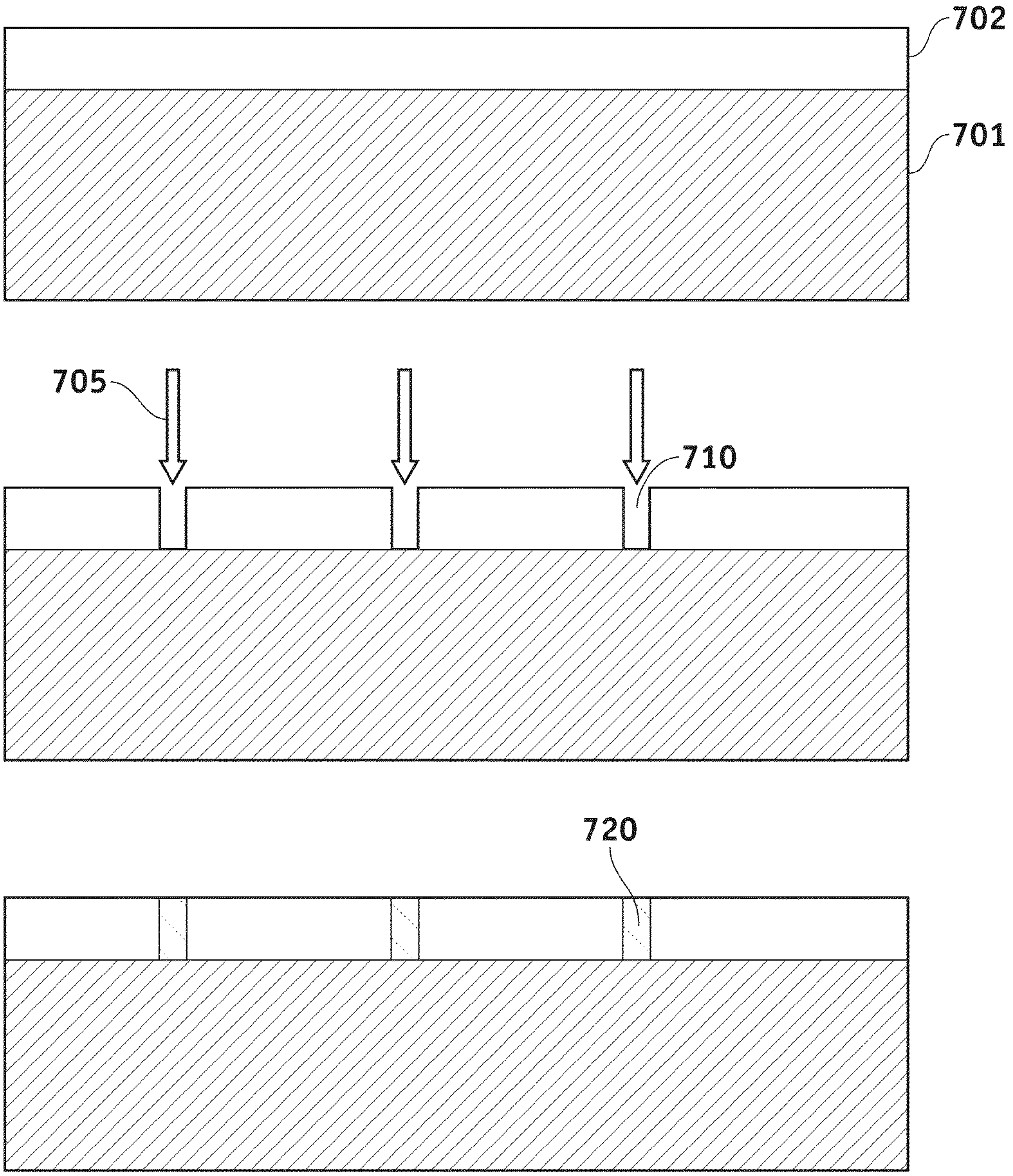
FIG. 7 shows an exemplary fabrication method according to the teachings of the present disclosure where fluoride is used as self-developing resist for electroplating mask.

FIG. 7 shows an exemplary fabrication method according to the teachings of the present disclosure. The method essentially demonstrates how to use, for example, fluoride as self-developing resist for an electroplating mask. A first layer (701) is first provided, the layer serving as a substrate. A second layer (702) is then deposited on top of first layer (701). The second layer (702) can be composed of various materials, such as fluoride-based materials including, for example, $AlF_3$, LiF, $YbF_2$, $CuF_2$. The structure is then exposed with electron beams (705) to generate miniature trenches (710). This is followed by electroplating metal (720) into second layer (702). This process can be used, for example, to form the wiring (interconnects) between transistors and other components in an integrated circuit, based on a desired interconnection scheme.

In the past, vacuum diodes and triodes with emitter-anode dimensions down to 7 nm have been developed. Same devices with emitter-anode dimensions of less than 7 nm, e.g. 2 nm, can be fabricated based on the described methods. The existing field emission triodes have been limited by the high impedance of the devices, a direct result of the work function of the emitters that limit the minimum operating voltage to above 5V. Several approaches have been adopted to overcome this limitation, including using multi-tip emitters and coating the emitters with low work function materials, but the emission voltage can still not be reduced to below 3V using the existing solutions.

The enhanced lithographic fabrication techniques disclosed herein allow for the construction of structures with, for example, 2 nm electrode spacing, enabling access to the metal-vacuum-metal (MVM) tunneling mechanism. As a result, the construction of MVM triodes and multi-terminal tunnel devices having low impedances becomes feasible. Such devices can exhibit superior performance compared to conventional semiconductor transistors. Furthermore, their robustness is ensured, as MVM tunneling relies on well-established physics—that is used in scanning tunneling microscopes (STM), a common surface characterization technique. The essential dimensions required to implement these devices are readily accessible through the utilization of state-of-the-art silicon fabrication lines.

What is claimed is:

1. A method of fabricating a miniature quantum point contact comprising:
- providing a first layer, the first layer including metal;
- depositing a second layer on top of the first layer, the second layer comprising an insulating electron beam resist, and
- exposing the second layer to an electron beam to generate a miniature quantum point contact, the miniature quantum point contact having a constriction width of less than 7 nm.

2. The method of claim 1, wherein the electron beam resist comprises metal fluoride.

3. The method of claim 2, wherein the metal fluoride is selected from one of $AlF_3$, LiF, $YbF_2$, $CuF_2$, AgF, NbF5, CeF3, CaF2, MgF2, PbF2, or BiF3.

4. The method of claim 2, wherein the metal of the first layer comprises a pre-deposited metal or highly conducting semiconductor, such as gold, copper, aluminum, silicon, iron, nickel, chromium, platinum, or graphite.

5. A method of fabricating a miniature wire comprising:
providing a first layer comprising an insulated layer with two metal contacts on top;
depositing a second layer on top of the first layer, the second layer comprising an insulating electron beam resist;
exposing the second layer to an electron beam going from one metal contact to another metal contact of the two metal contacts, across an exposure line, thereby forming the miniature wire that connects the two metal contacts, the miniature wire having a width of less than 7 nm.

6. The method of claim 5, wherein the electron beam resist comprises metal fluoride.

7. The method of claim 6, wherein the metal fluoride is selected from one of $AlF_3$, LiF, $YbF_2$, or $CuF_2$, AgF, NbF5, CeF3, CaF2, MgF2, PbF2, or BiF3.

8. The method of claim 6, wherein the miniature wire comprises the metal making up the fluoride, such as copper, aluminum gold, platinum, niobium or ytterbium.

9. The method of claim 6, further comprising depositing an oxidation barrier layer on top of the second layer to cover the miniature wire, thereby protecting the miniature wire from oxidation.

10. A method of via-hole fabrication comprising:
providing a first layer serving as a substrate;
depositing a second layer on top of the first layer, the second layer comprising an insulating electron beam resist;
exposing the second layer with an electron beam to generate a miniature hole inside the second layer; the miniature hole having a constriction width of less than 7 nm; and
by using the second layer as an etch mask, etching through the first layer, to generate a via through the miniature hole and inside the first layer, the via having a width of less than 7 nm.

11. The method of claim 10, wherein the electron beam resist comprises metal fluoride.

12. The method of claim 10, wherein the metal fluoride is selected from one of $AlF_3$, LiF, $YbF_2$, $CuF_2$, SrF2, BaF2, CaF2, MgF2, NaF, or alloys using these fluorides.

13. A method of generating interconnects comprising:
providing a first layer serving as a substrate;
depositing a second layer on top of the first layer, the second layer comprising an electron beam resist;
exposing the second layer with an electron beam to generate miniature trenches inside the second layer, based on an interconnection scheme, the miniature trenches having widths of less than 7 nm, and
electroplating metal into the second layer along the miniature trenches.

14. The method of claim 13, wherein the electron beam resist comprises metal fluoride.

15. The method of claim 14, wherein the metal fluoride is selected from one of $AlF_3$, LiF, $YbF_2$, or $CuF_2$, SrF2, BaF2, NaF, AgF, NbF5, CeF3, CaF2, MgF2, PbF2, or BiF3.

16. A method of fabricating an array of miniature quantum points contacts, comprising:
providing a first layer, the first layer including metal;
depositing a second layer on top of the first layer, the second layer comprising an electron beam resist, and
exposing the second layer to an array of electron beams to generate the array of miniature quantum point contacts, the miniature quantum point contacts having each a constriction width of less than 7 nm.

17. A method of fabricating a miniature conducting point contact comprising:
providing a first layer, the first layer including metal;
depositing a second layer on top of the first layer, the second layer comprising an insulating electron beam resist, and
exposing the second layer to an electron beam to generate a miniature conducting point contact, the miniature conducting point contact having a constriction width of less than 7 nm.

18. The method of claim 17, wherein the miniature conducting point contact comprises a metal point contact.

* * * * *